United States Patent [19]

Su

[11] Patent Number: 5,039,953
[45] Date of Patent: Aug. 13, 1991

[54] CLASS AB CMOS OUTPUT AMPLIFIER

[75] Inventor: David K. Su, Stanford, Calif.

[73] Assignee: Hewlett-Packard Company, Palo Alto, Calif.

[21] Appl. No.: 526,082

[22] Filed: May 18, 1990

[51] Int. Cl.$^5$ .......................... H03F 3/26; H03F 3/16
[52] U.S. Cl. ..................................... 330/264; 330/255
[58] Field of Search ............... 330/253, 255, 264, 277, 330/311, 269

[56] References Cited

U.S. PATENT DOCUMENTS 4,284,957  8/1981  Hague ............................. 330/264 X
4,570,128  2/1986  Monticelli ........................... 330/267

OTHER PUBLICATIONS

Saari, "Low-Power High-Drive CMOS Operational Amplifiers", IEEE Journal of Solid-State Circuits, vol. SC-18, No. 1, Feb. 1983, pp. 121-125.

Glaser et al., Integrated Circuit Engineering, Design, Fabrication, and Applications, Addison-Wesley Publishing Company, May 1979, Chap. 12, pp. 456-541.

Primary Examiner—Steven Mottola

[57] ABSTRACT

A simple class CMOS AB amplifier capable of operating from a single 3 volt supply while driving a 2000 picofarad load.

7 Claims, 1 Drawing Sheet

INPUT STAGE | LEVEL SHIFTER | OUTPUT STAGE

5,039,953

CLASS AB CMOS OUTPUT AMPLIFIER

FIELD OF THE INVENTION

The present invention relates to class AB amplifiers, and more particularly relates to a simple, area efficient class AB CMOS amplifier that can be operated with very low voltage power supplies, thereby making it suitable for use in a variety of low voltage applications.

BACKGROUND AND SUMMARY OF THE INVENTION

CMOS analog integrated circuits (such as operational amplifiers), and the use of class AB amplifiers as output stages thereof, are well known in the analog IC art. Heretofore, however, such amplifiers suffered by reason of their complexity (typically of the associated bias circuitry) and their requirements for relatively high operating voltages.

In accordance with the present invention, a CMOS operational amplifier is provided with improved input, predriver and output stages that overcome drawbacks of the prior art. The input stage features high gain and a very small offset voltage. The predriver and output stages cooperate to yield low distortion class AB operation with a minimum of circuit complexity. The resulting amplifier can be operated with a single 3 volt power supply and is ideal for driving large capacitive loads in systems requiring very low power consumption.

The foregoing and additional features and advantages of the present invention will be more readily apparent from the following detailed description thereof, which proceeds with reference to the accompanying drawings.

DETAILED DESCRIPTION

Figure 1:
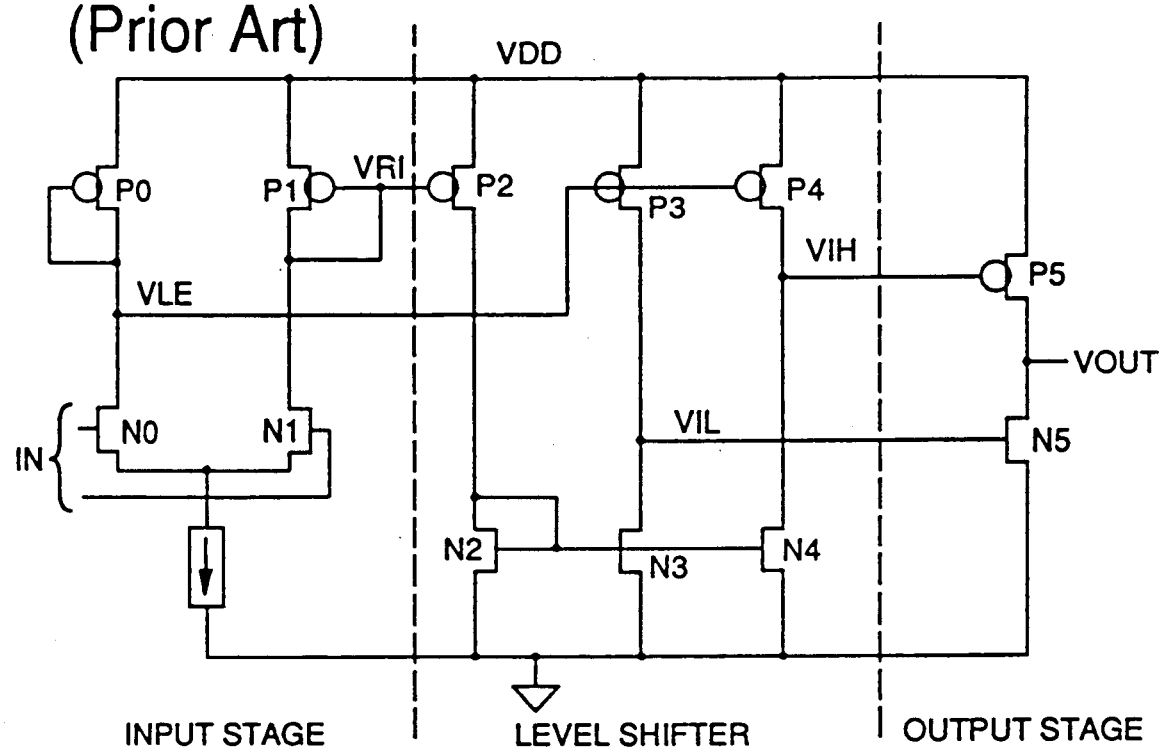
FIG. 1 is a schematic diagram of a prior art CMOS class AB amplifier.

A prior art low power CMOS operational amplifier 10 is shown in FIG. 1. An amplifier 12 according to one embodiment of the present invention is shown in FIG. 2.

Figure 2:
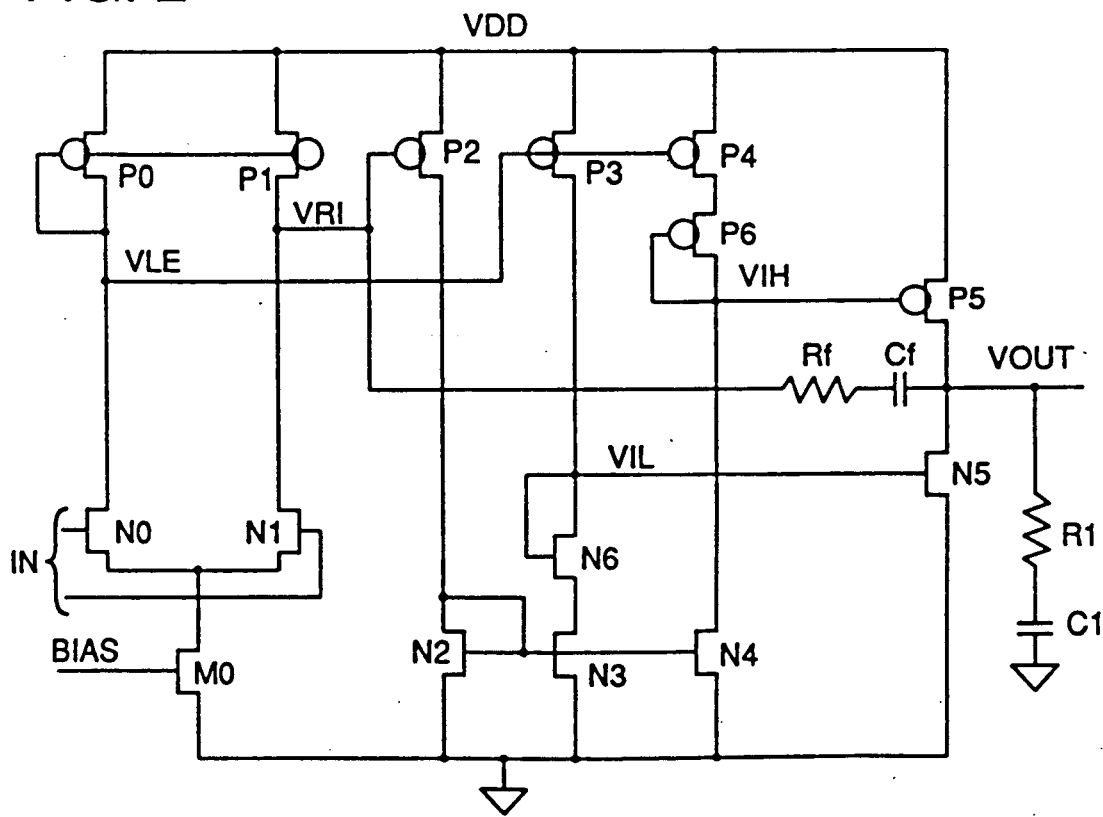
FIG. 2 is a schematic diagram of a CMOS class AB amplifier according to one embodiment of the present invention.

The FIG. 2 amplifier has several distinct advantages over that of FIG. 1. One is high open-loop gain, which minimizes steady state error. Another is that rail-to-rail voltage drive on the gate terminals of the output transistors of amplifier 12 maximizes their current drive capability.

These advantages are secured by making two significant changes to the FIG. 1 topology. The first is to increase the input stage gain so as to minimize overall input offset voltage. The second is to employ a new class AB output stage in order to minimize cross-over distortion.

To minimize the input offset voltage, the amplifier 12 employs a differential input with active loads. The two load transistors, P0 and P1 are connected as current mirrors. Unlike the design shown in FIG. 1, the drain and gate of transistor P1 are not connected. This configuration provides high gain from the differential input to node VRI. Being a high impedance point, node VRI can be established as the dominant pole of the amplifier for frequency stability.

A high input stage gain is important for amplifier performance because the output stage requires inherent mismatches to minimize DC standing current. Since the input offset contributions from the output stage are reduced by the open-loop gain of the first stage, the high input gain minimizes the overall input offset voltage. Overall systematic offset voltage is less than 0.2 millivolts.

Random offset voltage is minimized by selecting large transistor sizes for the two input transistors to allow better layout matching. Special attention is given to the layout of these transistors to provide a common-centroid inter-digitated configuration that enhances device matching.

Turning now to the output stage, it was desired to provide a simple output topology. The requirement of a 3 volt supply voltage dictated that any path from the supply to ground should contain no more than three series transistors. These factors eliminated several choices of AB output stages.

In the FIG. 2 amplifier 12, a pair of drain-connected CMOS transistors (P5, N5) are employed as the final output stage because they allow large output voltage swings close to the supply rails. However, this complicates the design of the predriver stages. Gates of the two output transistors must be driven with the same AC signal at different DC levels. During quiescent conditions, both output transistors must be kept near their off states to minimize power consumption. When a transient signal is applied to the input, gates of these transistors are momentarily driven to the supply rails to maximize output current drive.

The output transistors are kept near their offstates by mismatches in the pre-drivers through unbalanced current mirroring. Ignoring transistors N6 and P6 for the present discussion, the voltage at node VIL must be near zero to keep output transistor N5 off during its quiescent state. This is accomplished by adjusting the width to length (W/L) ratio of transistors N3 and P3. Current mirrored into transistor N3 from transistor P1 by way of P2 and N2 is 20% larger than the current mirrored into transistor P3 from transistor P0. This current imbalance forces transistor N3 into triode state and keeps the voltage at node VIL near zero. Similarly, the sizes of transistors P4 and N4 are chosen to give transistor P4 20% more current than transistor N4. This ensures the voltage at node VIH is near VDD during quiescent conditions.

Without transistors N6 and P6, the output stages are completely shut off during quiescent conditions. Crossover distortion and delays corresponding to the turning on and off of the output transistors would introduce unacceptable noise to the output waveform. To alleviate this problem, a small standing current is maintained in the output transistors so that both devices are never off during quiescent conditions. That is, the gates of the output transistors must be kept at about one threshold from the supply rails. In the FIG. 2 amplifier 12, two $V_T$-connected CMOS transistors, P6 and N6, are inserted in the pre-driver stages to keep the output transistors slightly on during quiescent state by current mirroring. The drains and gates of these $V_T$-connected transistors are tied to provide one threshold voltage between their source and drain. Currents through transistors P6 and N6 are mirrored to the output transistors during quiescent state to establish a small standing current. Note that because of the finite on-resistance of P4 and N3, the current through transistor P5 and N5 is higher than that predicted by current mirroring from P6 and N6.

During transient conditions with large capacitive loads, the output transistors could temporarily be driven into triode region. A large transient current would be supplied to charge up the output load. This design provides a rail-to-rail voltage swing on the gates of the output transistors that maximizes the output current drive capability. In the preferred design, the output transistors are the smallest transistors of the amplifier.

To assure close-loop unity gain stability for output loads in the application-specific range of 0 to 2000 picofarads, a pole-splitting frequency compensation network was employed. The signal path from VRI to the output forms an integrator with an inverting gain. With Miller effect, a dominant pole is readily established at node VRI by adding feedback capacitor $C_f$. By adding a series resistor $R_f$, a zero is introduced to cancel the pole at the output node. However, the pole due to the load capacitor can vary more than a decade as the capacitor changes from 0 to 2000 picofarads. Full cancellation could not be achieved for all load conditions. A compromise was achieved by adjusting the position of the zero formed by the feedback network to give stable responses at both zero load and maximum load conditions. A 20 picofarad capacitor C1 was added to the output to establish a minimum capacitive load condition. With no external load, this capacitor did not provide adequate phase margin for stability. Instead of increasing this capacitance, a series 5 kilohm resistor was added to introduce a second zero slightly above the cross-over frequency. This zero has little impact on the magnitude, but adds about 30 degrees to the phase margin. In other applications, of course, other design constraints may lead to other frequency compensation techniques.

EXAMPLE

A preferred form of the amplifier is fabricated with the following parameters (the sizes are given as width-/length in micrometers):

| Device | Size |
|--------|------|
| N0 | 105/5 |
| N1 | 105/5 |
| N2 | 12/12 |
| N3 | 12/12 |
| N4 | 12/12 |
| N5 | 5/3 |
| N6 | 21/3 |
| P0 | 12/12 |
| P1 | 12/12 |
| P2 | 12/12 |
| P3 | 10/12 |
| P4 | 14/12 |
| P5 | 10/3 |
| P6 | 42/3 |
| M0 | 12/12 |
| Rf | 2 kilohms |
| R1 | 5 kilohms |
| Cf | 135/86 |
| C1 | 217/98 |

An amplifier constructed according to these specifications in a 1 micrometer-gate, single-layer poly, single layer metal, N-well CMOS process is unity-gain stable while driving capacitive loads of up to 2000 picofarads at frequencies of up to 10 kilohertz. The resistors $R_f$ and R1 are implemented using polysilicon lines. The capacitors $C_f$ and C1 are made of N-channel transistors in N-wells. The circuit operates from 3 to 5.5 volts over a temperature range of $-20$ C. to 65 C. with typical supply current of 20 microamperes. The common-mode input range of the amplifier ranges from 1 volt to within 250 millivolts of supply rail. Such an amplifier is well suited for service as a unity gain voltage buffer for digitally-controlled analog signals.

Having described and illustrated the principles of my invention with reference to a preferred embodiment thereof, it will be apparent that the invention can be modified in arrangement and detail without departing from such principles. Accordingly, I claim as my invention all such modifications as may fall within the following claims and equivalents thereto.

I claim:

1. In a CMOS amplifier with an output stage comprising first and second drain-connected CMOS output transistors driven by first and second CMOS predriver stages, each of said predriver stages comprising first and second drain-connected CMOS transistors, an improvement to each of the predriver stages comprising:
   mismatching currents applied to the first and second predriver transistors so that the current applied to the first predriver transistor is greater than the current applied to the second predriver transistor;
   serially interconnecting a third predriver transistor having its drain and gate tied together between the first and second predriver transistors; and
   driving the output transistor corresponding to said predriver stage from a node between the second and third of said predriver transistors.

2. The amplifier of claim 1 which further includes operating the output transistor corresponding to said predriver stage in class AB.

3. The amplifier of claim 1 which further includes:
   providing a differential input stage comprised of first and second input CMOS transistors driving third and fourth active load transistors, respectively, the gates of said load transistors being connected, the gate and drain of the third load transistor being connected, and the gate and drain of the fourth load transistor being unconnected.

4. The amplifier of claim 3 which further includes:
   coupling the connected drains of the output transistors to an output of the second input transistor through a resistor and a capacitor.

5. The amplifier of claim 1 in which an input stage offset voltage is less than 0.2 millivolts.

6. The amplifier of claim 1 in which one of the first or second predriver transistors is of the P-type, the other of said first or second predriver transistors is of the N-type, and the third predriver transistor is the same type as the first predriver transistor.

7. The amplifier of claim 1 wherein the mismatching currents are generated by:
   fabricating the first and second predriver transistors with different width to length ratios; and
   mirroring currents from corresponding first and second CMOS input transistors into said first and second predriver transistors.

* * * * *